United States Patent [19]
Ito et al.

[11] Patent Number: 6,070,310
[45] Date of Patent: Jun. 6, 2000

[54] METHOD FOR PRODUCING AN INK JET HEAD

[75] Inventors: Susumu Ito, Nishibiwajima-cho; Hiroyuki Ishikawa, Nisshin, both of Japan

[73] Assignee: Brother Kogyo Kabushiki Kaisha, Nagoya, Japan

[21] Appl. No.: 09/055,406

[22] Filed: Apr. 6, 1998

[30] Foreign Application Priority Data

Apr. 9, 1997 [JP] Japan ................................. 9-090993

[51] Int. Cl.[7] .............................. H04R 17/00; B41J 2/045
[52] U.S. Cl. .................. 29/25.35; 29/890.1; 29/847; 347/68; 347/71
[58] Field of Search ............................. 29/890.1, 25.35, 29/847, 852; 347/68, 71, 72, 69; 427/100

[56] References Cited

U.S. PATENT DOCUMENTS

| | | | |
|---|---|---|---|
| 3,984,598 | 10/1976 | Sarazin et al. | 427/100 |
| 4,521,667 | 6/1985 | Sachs | 29/847 |
| 4,536,097 | 8/1985 | Nilsson . | |
| 4,707,081 | 11/1987 | Mir | 29/847 |
| 4,963,974 | 10/1990 | Ushio et al. | 428/620 |
| 5,072,240 | 12/1991 | Miyazawa et al. | 29/25.35 |
| 5,625,395 | 4/1997 | Imai | 347/71 |
| 5,646,661 | 7/1997 | Asai et al. . | |
| 5,729,263 | 3/1998 | Thiel et al. | 347/71 |
| 5,801,731 | 9/1998 | Takahashi | 347/69 |
| 5,818,481 | 10/1998 | Hotomi et al. | 347/68 |

FOREIGN PATENT DOCUMENTS

| | | |
|---|---|---|
| 0 522 814 | 1/1993 | European Pat. Off. . |
| 0 653 303 | 5/1995 | European Pat. Off. . |
| 0 676 286 | 10/1995 | European Pat. Off. . |
| 1-188349 | 7/1989 | Japan ................... 29/890.1 |
| A-7-132589 | 5/1995 | Japan . |
| A-9-29977 | 2/1997 | Japan . |
| A-9-131866 | 5/1997 | Japan . |

*Primary Examiner*—Lee Young
*Assistant Examiner*—A. Dexter Tugbong
*Attorney, Agent, or Firm*—Oliff & Berridge, PLC

[57] ABSTRACT

The invention relates to forming, on a piezoelectric element, a plurality of piezoelectric walls and concave grooves so as to be arranged alternately and parallel to each other. Thereafter, a conductive layer of a metallic thin film is formed on the back end surface and the bottom surface opposite to the grooved side of the actuator board, side surfaces of the piezoelectric walls, and the electrodes are conductably connected with the conductive layer. Then, the actuator board is subjected to a dicing process or the like to form a plurality of dividing lateral grooves on a back end surface and a bottom surface of the actuator board, forming a plurality of divided conductive patterns extending in the front and rear direction of the actuator board, and additionally, to form a dividing longitudinal groove intersecting with the lateral grooves on the bottom surface, separating the conductive patterns from other portions of the conductive layer.

19 Claims, 13 Drawing Sheets

METHOD FOR PRODUCING AN INK JET HEAD

BACKGROUND OF THE INVENTION

1. Field of the Invention

The present invention relates to a method for producing an ink jet head.

2. Description of Related Art

Communication devices such as a facsimile apparatus or information processors such as a personal computer generally have a recording device capable of recording data including characters and figures on a printing sheet to record the data as visual information. For such the recording device, various types of printing methods such as an impact type, a thermal type, and an ink-jet type are used. In recent years, an ink jet recording apparatus using an ink jet type recording which is superior in silence and enables printing on a printing sheet made of various materials has received attention.

The ink jet apparatus is provided with an ink jet head for printing data such as characters and figures by ejecting ink onto a printing sheet. The ink jet head is, as shown in FIG. 15, provided with an actuator board 72 which is made of an piezoelectric element. On the actuator board 72, a plurality of piezoelectric side walls 73 and concave grooves 74 are alternately arranged. Each of the piezoelectric side walls 73 is constructed of a piezoelectric layer which is polarized in a height direction of the side wall 73, each surface of the piezoelectric side walls is provided thereon which an electrode 75. The electrode 75 is provided on each surface of the piezoelectric side walls 73 so as to be independent of each other. The electrodes 75 are connected conductably with conductive patterns 87 which are formed of conductive layers provided on closing portions 74A for closing back ends of the concave grooves 74 respectively. To the conductive patterns 87, a plurality of lead wires 85 are connected by a soldering way and the like. Each of the lead wires 85 is also connected to a printed lead wire 86A provided on a print board 86 by, for example, a soldering operation to connect each electrode 75 to a control unit 88 of the recording apparatus.

A cover plate 80 provided with an ink supply port 79 is adhered on a grooved side of the actuator board 72. This cover plate 80 and each of the concave grooves 74 construct an ejection channel 81 in which ink is to be supplied. A nozzle plate 82 for closing each ink chamber 81 is adhered to an end of the actuator 72 and the cover plate 80. In the nozzle plate 82 are formed a plurality of nozzles 83 individually corresponding to the ejection channels 81. It is noted that the ejection channel 81 is connected with an ink storing tank not shown through the ink supply port 79.

The ink jet head constructed as above is produced by the following producing method.

First, the actuator board 72 is subjected to a grooving process plural times to make grooves each of which opens at one end of the actuator board 72 in a longitudinal direction thereof (the direction A in FIG. 15) and extends close to another end, whereby a plurality of concave grooves 74 and the piezoelectric side walls 73 are formed so as to be arranged alternately in a width direction (the direction B in FIG. 15) of the board 72, both which extend in the longitudinal direction parallel to each other.

Next, a conductive layer of metallic thin film is formed by a vacuum deposition method on each upper surface and both side surfaces of the piezoelectric side walls 73 and each upper surface of the closing porion 74A. Thereafter, the upper surfaces of the piezoelectric side walls 73 are subjected to a grinding process to remove the conductive layer therefrom, thereby to form the independent electrode 75 on each side surface of the piezoelectric side wall 73. After that, while each lead wire 85 is welded to the conductive patter 87 of the closing portion 74A corresponding thereto by a soldering operation and the like, the cover plate 80 and the nozzle plate 82 are adhered to the actuator board 72, which completes the manufacture of the ink jet head 71 provided with a plurality of ejection channels 81 in which ink is supplied.

The ink jet head 71 produced as above is installed in the recording apparatus and connected to the ink storing tank through the ink supply port 79 of the cover plate 80, thereby filling each of the ejection channels 81 with ink. Prior to the installation of the ink jet head 7 in the recording apparatus, each of the lead wires 85 is welded to each of the lead wires 86A of the printed board 86 by a soldering operation and the like to connect the electrodes 75 to the control unit 88 respectively. In the ink jet head 71, a predetermined ejection channel 81 is selected according to data including characters or figures, and driving voltage is applied to the electrodes 75 of the adjacent piezoelectric side walls 73 through the corresponding conductive patterns 87 thereby to deform the piezoelectric side walls 73 to reduce the volume of the ejection channel 81. The ink jet head 71 then ejects ink through the ejection channels 81 by an ejection energy resulting from the positive pressure in the inside of the ejection channel 81.

However, in the ink jet head producing method in the prior art, a plurality of lead wires 85 are needed to be welded by a soldering operation at two points, i.e., the conductive pattern 87 and the lead wire 86A of the printed board 86, to connect each electrode 75 provided on each side surface of the piezoelectric side wall 73 with the control unit 88 of the recording apparatus. This may cause a complicated operation to connect the electrode 75, and an increase of soldered portions may causes many inconveniences such as connection failure or cross-connection, resulting in a deterioration in the reliability of connection and the reliability of ink ejection.

SUMMARY OF THE INVENTION

The present invention has been made in view of the above circumstances and has an object to overcome the above problems and to provide a method for producing an ink jet head with high reliability, capable of decreasing steps required for connecting each conductive layer (electrode) connected with a piezoelectric wall (an energy generating means) to a control unit, thereby to enhance the reliability of connection to the control unit.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, a method for producing an ink jet head of this invention comprises the steps of forming an actuator board having a parallelepiped shape with a first plane and a second plane, which is made of piezoelectric ceramic material, forming a plurality of piezoelectric walls by making grooves in the first plane of the actuator board in a longitudinal direction thereof, forming conductive layers made of metallic thin film on a part of both side surfaces of the piezoelectric wall, a first end plane of the actuator board, and an entire surface of the second plane of the actuator board so that the conductive layers are connected with each other, forming a plurality of conductive patterns, each of which is conductably connected with the conductive layer formed on the side surfaces of the piezoelectric wall, on the second plane of the actuator board by forming first grooves in the conductive layer formed on the first end plane of the actuator board in a vertical direction in correspondence with each of the piezoelectric walls and forming second grooves in the conductive layer formed on the second plane of the actuator board so as to be continuous to the first grooves, electrically dividing the conductive layer on the second, plane of the actuator board into the conductive patterns and another remaining part of the conductive layer by forming a third groove intersecting the second grooves, adhering a cover plate onto upper planes of the piezoelectric walls, and adhering a nozzle plate onto a second end plane of the actuator board, the nozzle plate being provided with nozzles in correspondence to ejection channels each formed between the piezoelectric walls.

According to the present invention, after the formation of the conductive layer on each part of both side surfaces of the piezoelectric wall, the first end plane of the actuator board, and an entire surface of the second plane of the actuator board so that respective conductive layers are connected with each other, the conductive pattern formed on the second plane of the actuator board is divided into a plurality of conductive patterns connected with the conductive layer formed on the side planes of the piezoelectric walls and the remaining conductive layer. This makes it possible to ensure independence of each conductive pattern and to produce an ink jet head with the high reliability on connection with a control unit and also the high reliability on ink ejection.

According to another aspect of the invention, there is provided a method for producing an ink jet head comprising steps of forming an actuator board having a parallelepiped shape with a first plane and a second plane, which is made of piezoelectric ceramic material, forming a plurality of piezoelectric walls by forming grooves in the first plane of the actuator board in a longitudinal direction thereof to alternately make first concave grooves extending from a first end plane of the actuator board to a second end plane and second concave grooves which open at the first end plane of the actuator board and close at the second end plane, forming conductive layers made of metallic thin film on side surfaces of the piezoelectric wall opposite to each other in the first concave groove, the second end plane of the actuator board, and an entire surface of the second plane of the actuator board so that the conductive layers are connected with each other, and on side surfaces of the piezoelectric wall opposite to each other in the second concave groove so as to be connected with the conductive layer on the second plane of the actuator board, forming a plurality of individual conductive patterns in the second plane of the actuator board by forming first grooves in the conductive layer formed on the second plane of the actuator board in correspondence with each of the second concave grooves to connect the conductive layers formed on the side planes of the piezoelectric walls constructing two adjacent second concave grooves between which the first concave groove is provided, forming a common conductive pattern by forming a second groove intersecting the first grooves thereby to divide the conductive layer formed on the second plane of the actuator board into the individual conductive patterns and another remaining part of the conductive layer, adhering a cover plate on upper planes of the piezoelectric walls, and adhering a nozzle plate on the second end plane of the actuator board, the nozzle plate being provided with nozzles in correspondence to ejection channels each formed between the piezoelectric walls.

In the above method, after the formation of the conductive layer on side surfaces of the piezoelectric wall opposite to each other in the first concave groove, the second end planes and the whole second plane of the actuator board so that respective conductive layers are connected with each other, and on side surfaces of the piezoelectric wall opposite to each other in the second concave groove so as to be connected with the conductive layer formed on the second plane of the actuator board, the conductive layer formed on the second plane of the actuator board is divided into a plurality of individual conductive patterns and the common conductive pattern, so that each of the individual conductive patterns is connected with the conductive layers formed on the side planes of the piezoelectric walls constructing two adjacent second concave grooves between which the first concave groove is provided and the common conductive pattern is connected with the conductive layers formed on the other side planes of the piezoelectric walls.

Accordingly, the number of conductive patterns can be reduced as compared with the construction of providing independent conductive patterns for every conductive layers formed on the piezoelectric walls, as a result thereof, the connecting operation to the control unit can be reduced. Since the present invention can provide independent conductive patterns as above, it can produce the ink jet head with high reliability.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIGS. 4(a) and (b) are explanatory views showing process devices to make a dividing groove and longitudinal grooves in the ink jet head in the first embodiment, wherein FIG. 4(a) is a perspective view showing a process device for performing a dicing process and FIG. 4(b) is a perspective view showing another process device using YAG laser beam;

DETAILED DESCRIPTION OF THE PREFERRED EMBODIMENTS

A detailed description of preferred embodiments of a method for producing an ink jet head embodying the present invention will now be given referring to the accompanying drawings.

First, a method for producing an ink jet head in the first embodiment according to the present invention will be described below along with a structure of the ink jet head referring to FIG. 1 through FIG. 9.

Figure 1:
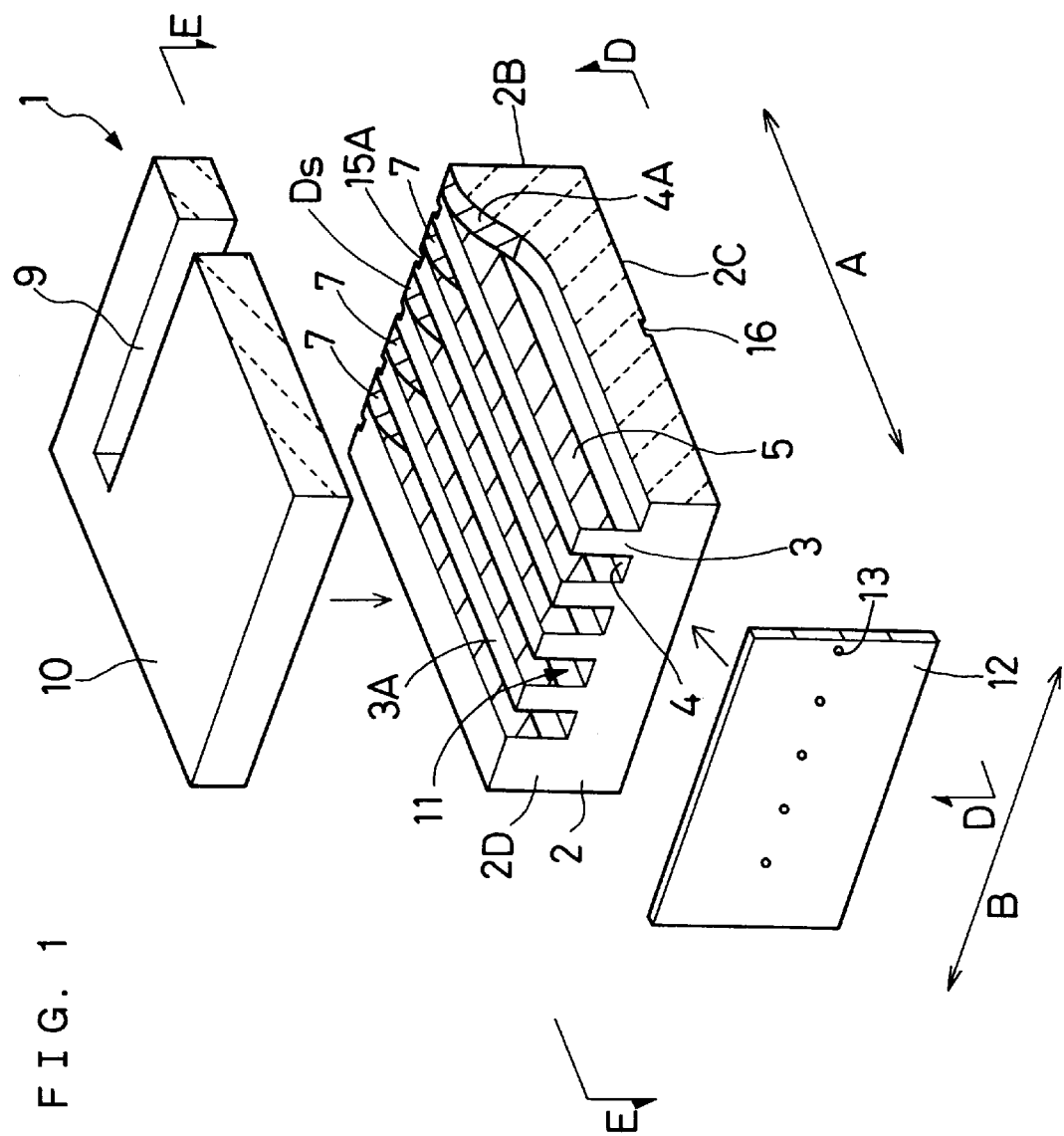
FIG. 1 is a perspective view of an ink jet head in a first embodiment according to the present invention.
Figure 2:
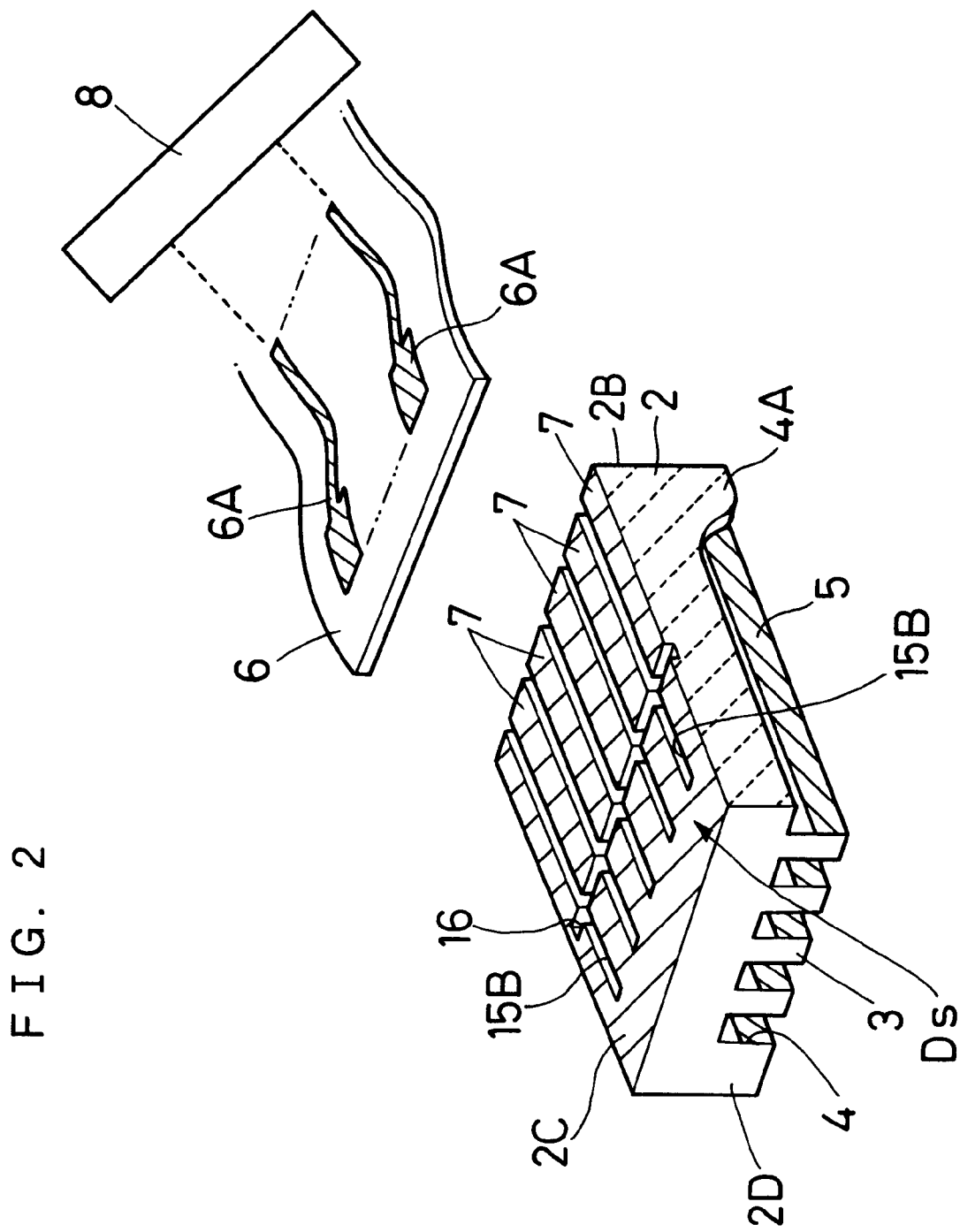
FIG. 2 is a perspective view of the ink jet head taken along the line D—D in FIG. 1.
Figure 3:
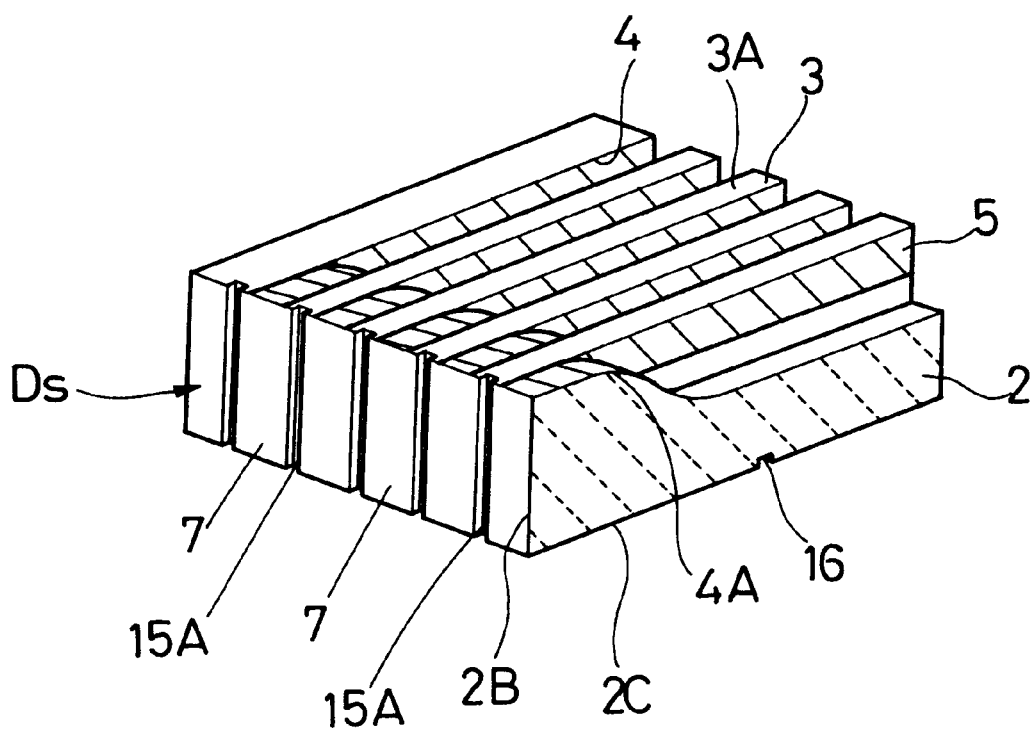
FIG. 3 is a perspective view of the ink jet head taken along the line E—E in FIG. 1.
Figure 4:
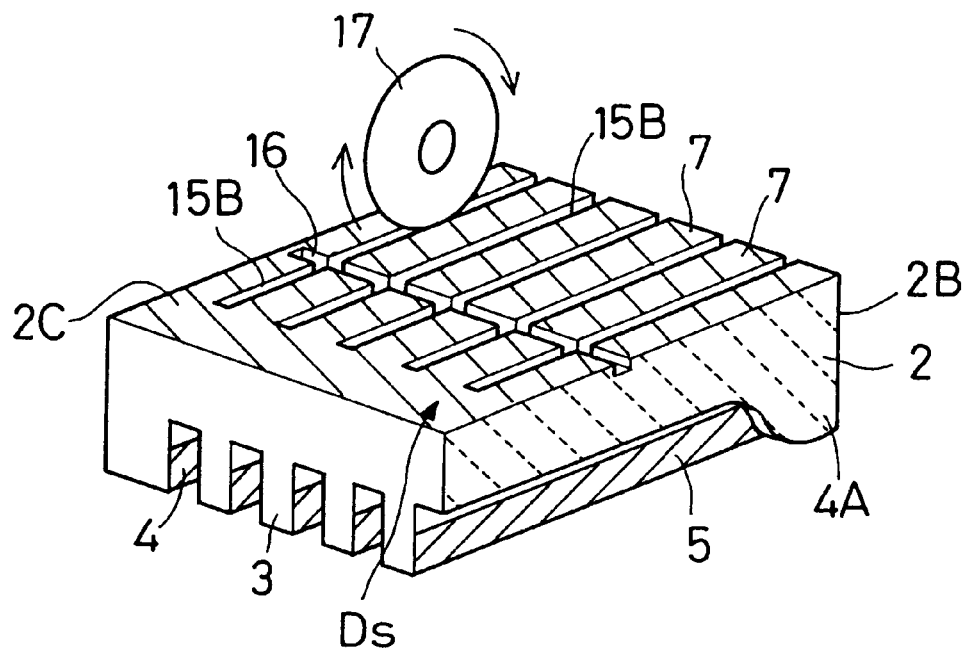
Figure 4:
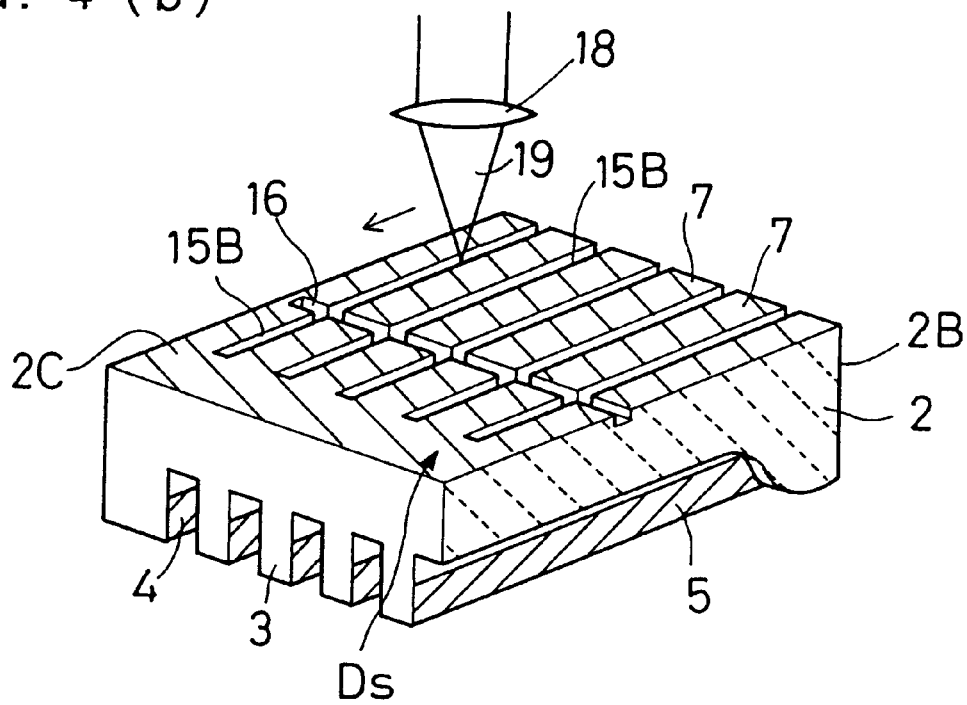

In FIG. 1, the ink jet head 1 is provided with an actuator board 2 which is a piezoelectric element in a parallelepiped shape. On the piezoelectric element 2, a plurality of piezoelectric walls 3 (energy generating means) and concave grooves 4 are formed so that the walls 3 and the concave grooves 4 are arranged alternately and parallel to each other. Each piezoelectric wall 3 is constructed of a piezoelectric layer which is polarized in a height direction of the wall. An electrode 5 is formed on each surface of the piezoelectric walls 3. These electrodes 5 are provided on every side surfaces of the piezoelectric walls 3, independently of each other. As shown in FIGS. 2 and 3, a plurality of divided conductive patterns 7 formed over a back end surface 2B (a first end plane) and a bottom surface 2C (a second plane) of the actuator board 2 are electrically connected with each pair of electrodes 5 and 5 facing to each other inside each concave groove 4. Each of the conductive patterns 7 is provided extending in a back and rear direction (the direction A in FIG. 1) of the actuator board 2 on the bottom surface 2C so as to be parallel to each other, and is connected through each of lead wires 6A of a flexible board 6 to the control unit 8 of the recording apparatus for supplying driving voltage, as shown in FIG. 2.

A cover plate 10 provided with an ink supply port 9 is adhered to a grooved side of the actuator board 2. This cover plate 10 and the concave grooves 4 form a plurality of ejection channels 11 in which ink is to be supplied. A nozzle plate 12 for closing the ejection channels 11 is adhered to one end of the actuator board 2 and the cover plate 10, in which a plurality of nozzles 13 are formed in one-to-one correspondence to the ejection channels 11. It is noted that each ink chamber 11 is connected to an ink storing chamber not shown through the ink supply port 9.

The ink jet head 1 having the above structure is produced by a producing method described below, which is explained with reference to FIGS. 1 to 4.

In FIG. 1, the quadrilateral actuator board 2 is made of a piezoelectric ceramic material which has been polarized in a thickness direction thereof. To the actuator board 2, a grooving process is applied plural times to make grooves opening at an end of the actuator board 2 in the front and rear direction (the direction A in FIG. 1) and extending close to another end to form plural concave grooves 4 and piezoelectric walls 3 (energy generating means) which extend in the front and rear direction, parallel to each other, such that the walls 3 and the concave grooves 4 appear alternately in a width direction (the direction B in FIG. 1). As a grooving device, a diamond blade having the thickness capable of forming each concave groove 4 is used for a dicing process. Each concave groove 4 opens at a front end surface (a second end plane) 2D of the actuator board 2, but does not reach the back end surface 2B and is closed at the back end.

Next, a conductive layer Ds of a metallic thin film is formed, for example, by a vacuum deposition continuously on the back end surface 2B and the bottom surface 2C opposite to the grooved side of the actuator board 2, upper surfaces 3A and each upper half of side surfaces of the piezoelectric walls 3, and closing portions 4A formed at rear ends of the concave grooves 4. After the formation of the conductive layer Ds on the actuator board 2, a grinding process is applied to the upper surfaces 3A of the piezoelectric walls 3 to remove the conductive layer Ds therefrom, to form each electrode 5 made of the conductive layer Ds so as to be independently divided on each side surface of the piezoelectric walls 3. These electrodes 5 are connected to the conductive layer Ds formed on each of the surfaces 2B and 2C of the actuator board 2 except for the upper surface thereof through the conductive layer Ds of the closing portions 4A of the concave grooves 4.

It is noted that the forming method for the conductive layer Ds of the actuator board 2 is not limited to the vacuum deposition and it may be formed, for example, in such a manner that the whole surface of the actuator board 2 including the inside surfaces of the concave grooves 4 are coated with the conductive layer Ds of a metallic thin film by a surface process such as metal plating (for instance, nickel plating), and then the conductive layer Ds of the upper surface (the upper surfaces 3A of the piezoelectric walls 3) and front surface 2D of the actuator board 2 where each concave groove 4 opens is removed by a grinding process and the conductive layer Ds of the bottom surfaces of the concave grooves 4 is removed by a dicing process to provide independently divided electrodes 5. Furthermore, with respect to the portion of the actuator board 2, which does not need to be provided thereon with the conductive layer Ds (for example, the front end surface 2D and the upper surface 3A of each piezoelectric wall 3, etc.), it is also possible to form a resist film prior to the formation of the conductive layer Ds of a metallic thin film and, after the formation of the conductive layer Ds by a surface process such as plating and the like, to chemically remove the conductive layer Ds formed on the above portion by a lift-off system.

In order to connect each electrode 5 provided on each piezoelectric wall 3 to the control unit 8 of the recording apparatus, the conductive layer Ds on the back end surface 2B and the bottom surface 2C of the actuator board 2 is divided into a plurality of conductive patterns 7. The conductive patterns 7 are formed in a manner that, as shown in FIGS. 2 and 3, dividing lateral grooves 15A and 15B (first and second grooves) and a dividing longitudinal groove 16 are formed in the back end surface 2B and the bottom surface 2C of the actuator board 2, whereby the conductive layer Ds on the portions corresponding to the grooves is removed to divide the left conductive layer Ds.

More specifically, as shown in FIG. 3, a plurality of dividing lateral grooves 15A are formed on the back end surface 2B so that an end of each groove 15A is connected with the upper surface 3A of the piezoelectric wall 3 and another end extends to the bottom surface 2C of the actuator board 2. On the bottom surface 2C, a plurality of dividing lateral grooves 15B are formed such that an end of each groove 15B is connected with the corresponding groove 15A provided on the back end surface 2B and these grooves 15B extend parallel to the piezoelectric walls 3. On the bottom surface 2C, furthermore, the dividing longitudinal groove 16 (third groove) is formed intersecting with the plural dividing lateral grooves 15B to divide the piezoelectric layer Ds into a tip end portion and the other portions provided between the dividing lateral grooves 15B. Accordingly, those lateral grooves 15A and 15B and the longitudinal groove 16 divide the conductive layer Ds on the actuator board 2 into the conductive patterns 7 arranged parallel to each other in the width direction on the back end surface 2B and extend in the front and rear direction on the bottom surface 2C. Each of those conductive patterns 7 is also connected with a pair of electrodes 5 provided facing to each other inside each concave groove 4 through the conductive layer Ds provided on the closing portions 4A formed at the rear ends of the concave grooves 4.

For a process to make the lateral grooves 15A and 15B and the longitudinal groove 16, as shown in FIG. 4(a), a diamond blade 17 having the thickness capable of forming a desired groove width is used. A dicing process using the diamond blade 17 is applied to the actuator board 2 to form one lateral groove 15A on the back end surface 2B and one lateral groove 15B on the bottom surface 2C. Thereafter, the dicing process is repeated plural times by parallel moving the diamond blade 17 in the width direction of the actuator board 2 to form a plurality of lateral grooves 15A arranged parallel to each other and a plurality of lateral grooves 15B arranged parallel to each other. The longitudinal groove 16 intersecting with the lateral grooves 15B is then formed by a dicing process to divide the conductive layer Ds into individual conductive patterns 7.

Also, for another process to make the lateral grooves 15A and 15B and the longitudinal groove 16, as shown in FIG. 4(b), a YAG laser beam 19 which is emitted from a YAG (yttrium-aluminum-garnet) laser oscillator and focused by a f·θ lens 18 may be used. In this case, the YAG laser beam 19 is scanned onto the back end surface 2B and the bottom surface 2C to form one lateral groove 15A and one lateral groove 15B respectively. Thereafter, the scan of the YAG laser beam 19 is repeated plural times by parallel moving the beam in the width direction of the actuator board 2 to form a plurality of lateral grooves 15A arranged parallel to each other and a plurality of lateral grooves 15B arranged parallel to each other. The longitudinal groove 16 intersecting with the lateral grooves 15B is then formed by the scan of the YAG laser beam 19 to divide the conductive layer Ds into individual conductive patterns 7.

After the formation of the electrodes 5, the piezoelectric walls 3 (energy generating means), and the conductive patterns 7 on the actuator board 2, the actuator board 2 is coated, for example, with gold-plating and then subjected to a CVD process to protect the gold-plating with an oxide film (SiO film) in order to protect the conductive layer Ds (metallic thin film) of the electrodes 5 and the conductive patterns 7. After the protection of the conductive layer Ds with the gold-plating and the oxide film, as shown in FIG. 1, the cover plate 10 is adhered to the grooved side of the actuator board 2 to form, in combination with grooves 4, the ejection channels 11. A grinding process is then applied to the front end surface 2D of the actuator board 2 and a front end surface of the cover plate 10 to make them smooth. And, a nozzle plate 12 is adhered to the front end surface 2D so that the ejection channels 11 correspond to the nozzles 13 respectively and to cleaning and the like, to complete the producing of the ink jet head 1.

The ink jet head 1 produced as above is installed in the recording apparatus and is connected with an ink storing tank through the ink supply port 9 of the cover plate 10. Each of the ejection channels 11 is thus filled with ink. At the time of installation in the recording apparatus, as shown in FIG. 2, the conductive patterns 7 are each connected with the control unit 8 of the recording apparatus through the lead wires 6A of the flexible board 6.

Figure 5:
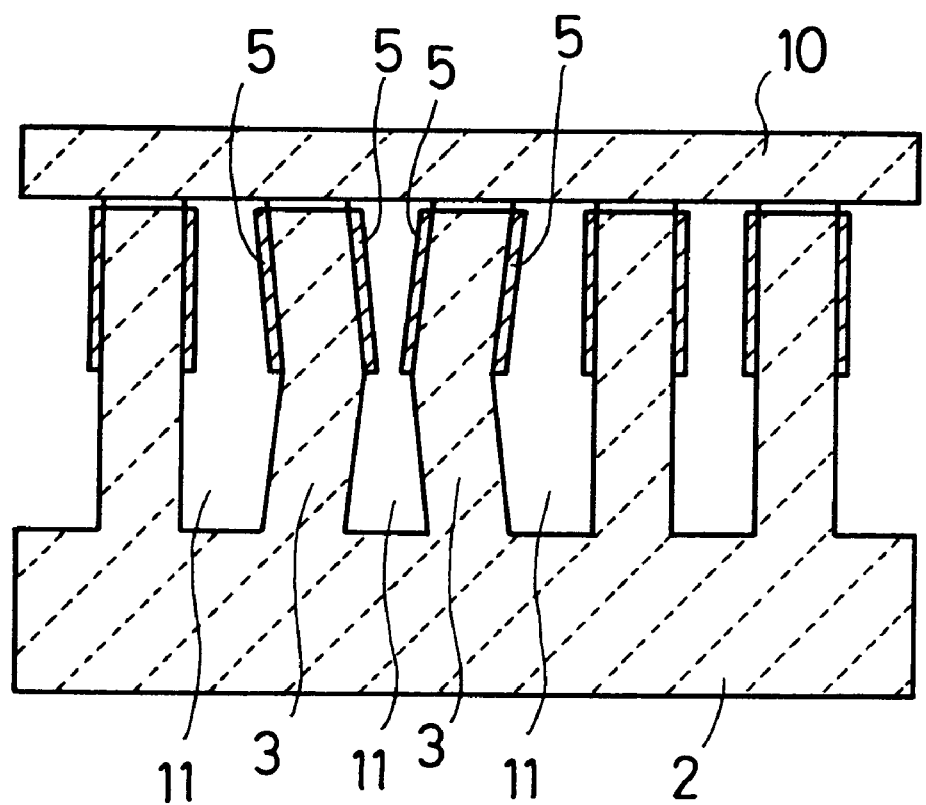
FIG. 5 is an enlarged sectional view of the ink jet head of FIG. 1 in an operation state.

In the ink jet head 1, as shown in FIG. 5, when a predetermined ejection channel 11 is selected according to data including characters or figures to be recorded, negative driving voltage (minus voltage) is applied through the conductive pattern 7 to two electrodes 5 facing to each other in the ejection channel 11 among the electrodes 5 on the adjacent two piezoelectric walls 3 and positive driving voltage (plus voltage) is applied to other two electrodes 5 which are respectively opposite to the above electrodes 5 with respect to each piezoelectric wall 3 to deform the adjacent piezoelectric walls 3 so as to reduce the volume of the ejection channel 11, generating ejection energy to eject ink droplets from the ejection channel 11 through the nozzle 13. When application of driving voltage to the electrodes 5 is stopped, the piezoelectric walls 3 return to a straight state, whereby ink is supplied through the ink supply port 9 into the ejection channel 11 which has just ejected ink. The control of the applied driving voltage is performed for each of the ejection channels 11 thereby to appropriately control the ejection of ink droplets through each nozzle 13 to print data including characters or figures onto a printing sheet.

Also, it may be arranged such that the polarization direction or the voltage application direction is reversed, as well as in FIG. 13 which will be mentioned later, whereby both the piezoelectric walls 3 can be made to deform in a direction so as to cause an increase in the volume of the ejection channel 11 between the adjacent piezoelectric walls 3. The ejection channel 11 is thus supplied with ink through the ink supply port 9. When the applied voltage to the piezoelectric walls 3 is then released, the walls 3 return to a straight state, thereby applying pressure to the ink in the ejection channel 11 to eject ink droplets through the nozzle 13. It is not always necessary to apply two types of voltages, positive and negative. It may be arranged such that any one of the voltages is grounded.

Although the ink jet head 1 wherein the concave grooves 4 are provided not entirely extending in the front and rear direction of the actuator board 2 is explained in the above embodiment, the present invention may also be applied to the ink jet head shown in FIGS. 6 to 9. The same numerals in FIGS. 6 to 9 as in FIGS. 1 to 4 indicate the same components.

The producing method for an ink jet head 21 shown in FIG. 6 which is another modification of the first embodiment is as follows.

A grooving process is applied to an actuator board 2 plural times to make grooves extending entirely in the front and rear direction of the actuator board 2 so that concave grooves 4 and a piezoelectric walls 3 appear alternately and parallel to each other. And, a conductive layer Ds of a metallic thin film is formed, for example, by a vacuum deposition on a back end surface 2B and a bottom surface 2C of the actuator board 2, and both side surfaces of the piezoelectric walls 3. After the formation of the conductive layer Ds on the actuator board 2, a grinding process is applied to the upper surfaces 3A of the piezoelectric walls 3 to remove the conductive layer Ds therefrom, resulting in the formation of each electrode 5 made of the conductive layer Ds independently divided on each side surface of the piezoelectric walls 3. These electrodes 5 are connected to the conductive layer Ds formed on each of the surfaces 2B and 2C of the actuator board 2.

Figure 7:
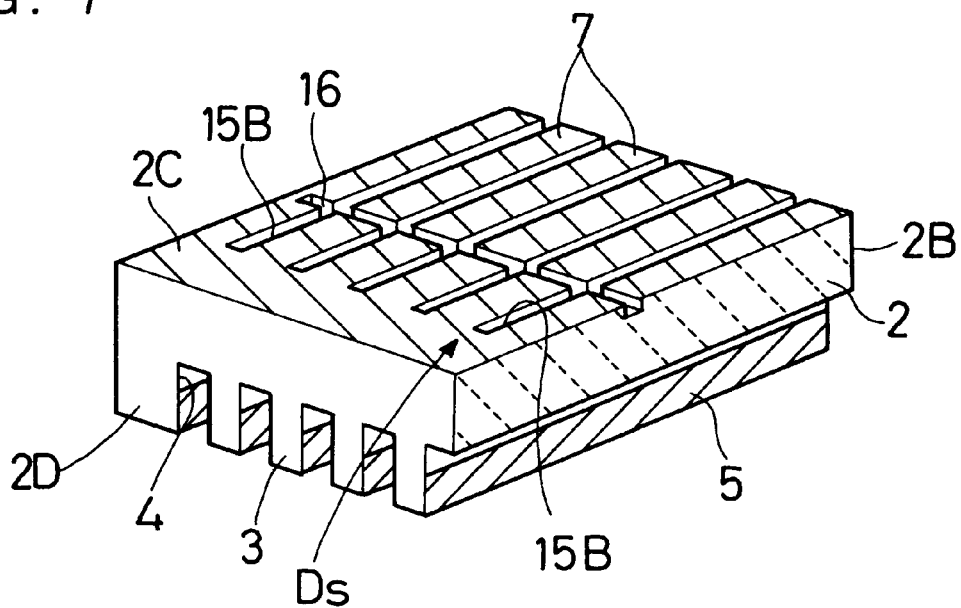
FIG. 7 is a perspective view of the ink jet head taken along the line F—F in FIG. 6.
Figure 8:
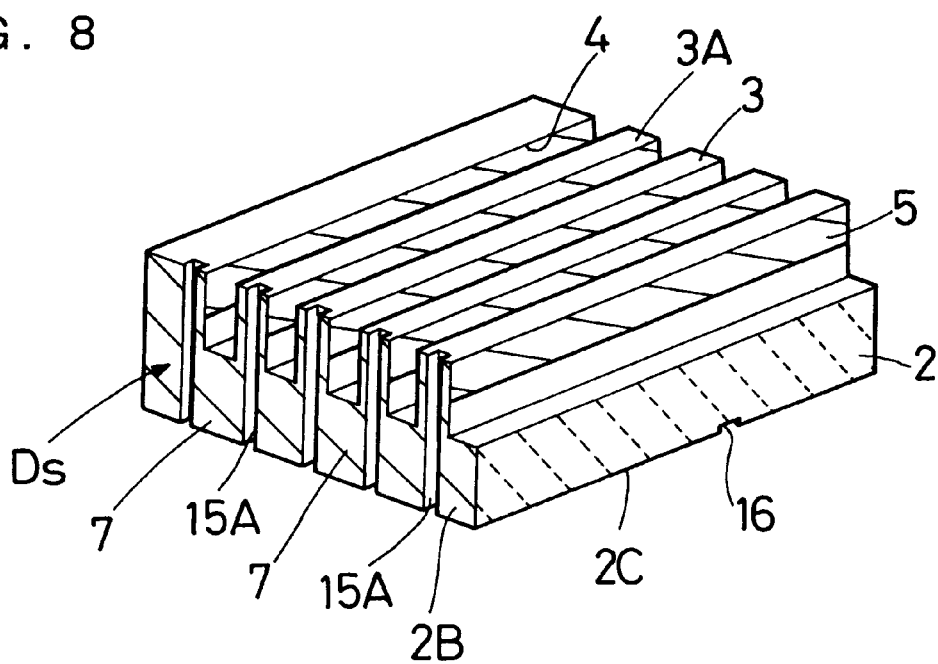
FIG. 8 is a perspective view of the ink jet head taken along the line G—G in FIG. 6.

Next, a dicing process or scan with a YAG laser beam 19 is applied to the actuator board 2, as well as in FIG. 4(a) or (b), to form a plurality of dividing lateral grooves 15A and 15B and a dividing longitudinal groove 16 as shown in FIGS. 7 and 8, forming a plurality of divided conductive patterns 7 connected respectively to a pair of electrodes 5 provided facing to each other in the concave groove 4.

After forming the electrodes 5, the piezoelectric walls 3, and the conductive patterns 7 on the actuator board 2, a gold-plating process and an oxide film forming process is performed in order to protect the conductive layer Ds. A cover plate 10' is then adhered to a grooved side of the actuator board 2. The cover plate 10' in cooperation with the concave grooves 4 thus forms the ejection channels 11. A manifold 22 having an ink supply port 22A connected to a common ink space B is also adhered to the back end surface 2B of the actuator board 2. A grinding process is applied to the front end surface 2D and a front surface of the cover plate 10' to make them smooth. A nozzle plate 12 is adhered to the front surface 2D of the actuator board 2 and the cover plate 10' so that the ejection channels 11 are in one-to-one correspondence to the nozzles 13, and is subjected to cleaning and the like, thus completing the producing of the ink jet head 21.

Figure 9:
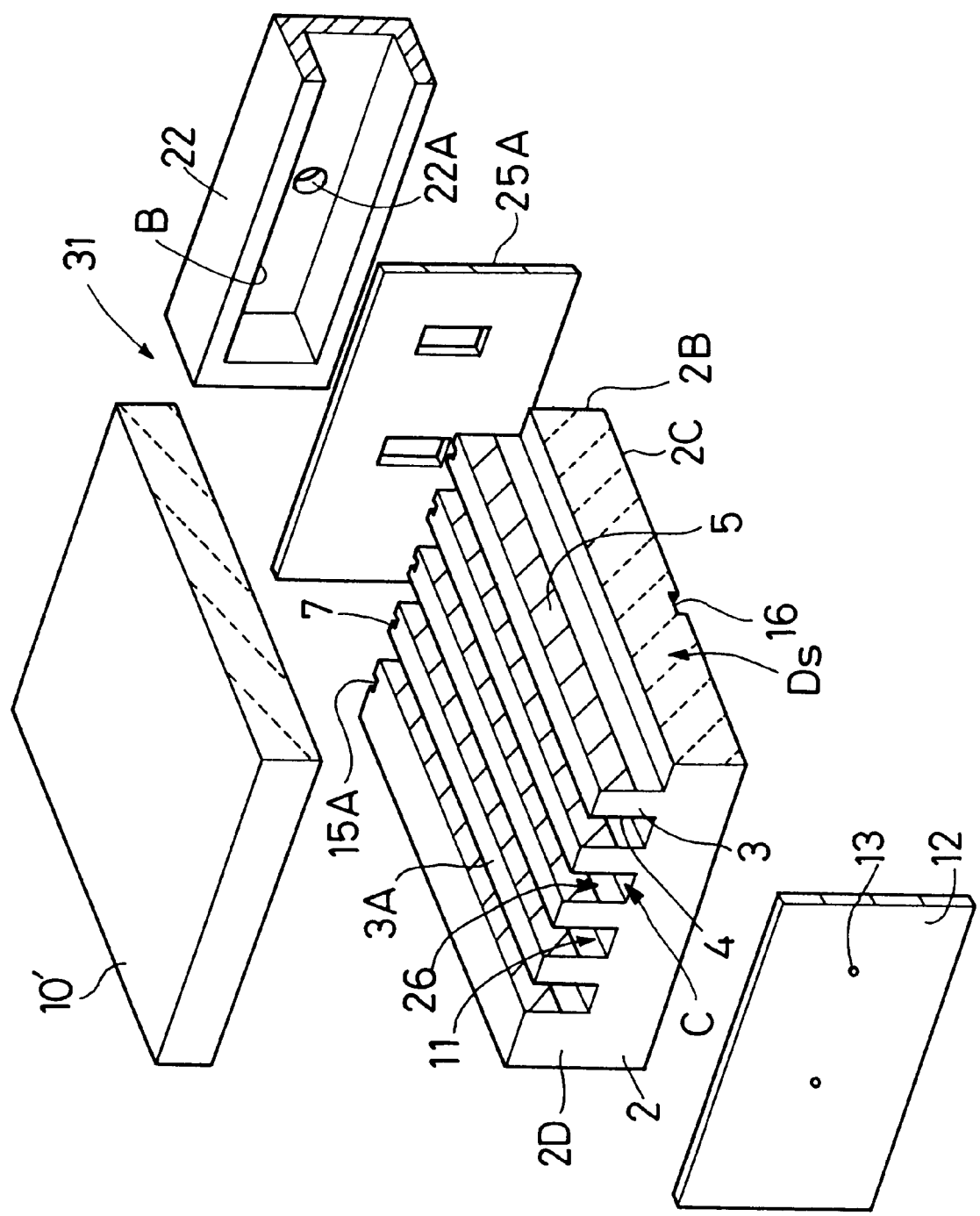
FIG. 9 is a respective view of another modification of the ink jet head of FIG. 1.

The producing method for an ink jet head 31 shown in FIG. 9, which is another modification of the first embodiment, is as follows.

Figure 6:
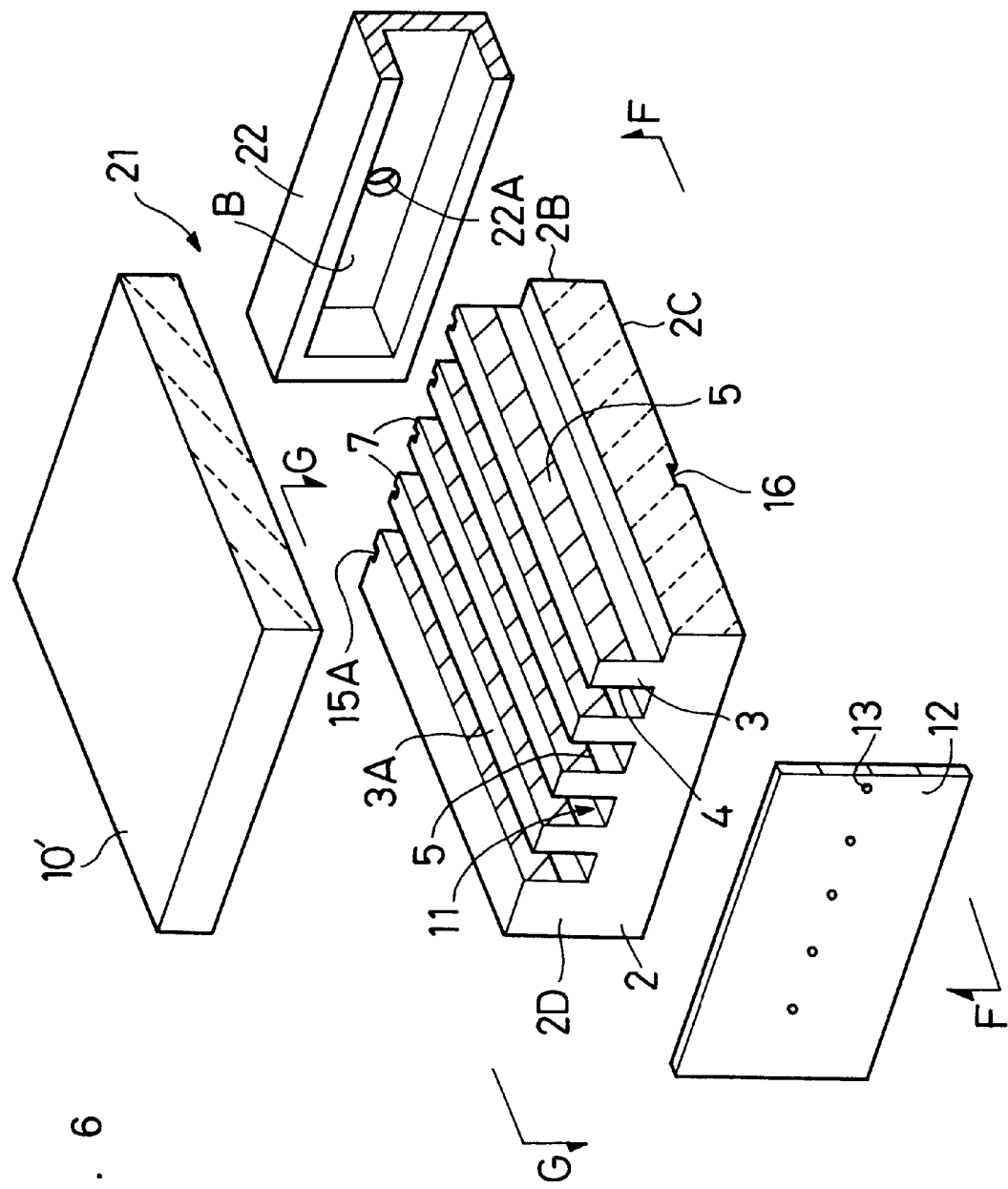
FIG. 6 is a perspective view of a modification of the ink jet head of FIG. 1.

In accordance with the same processes as the ink jet head 21 of FIG. 6, electrodes 5, piezoelectric walls 3 (energy generating means), and conductive patterns 7 are formed on an actuator board 2. A cover plate 10' is adhered to a grooved side of the actuator board 2 and, in cooperation with concave grooves 4, forms a plurality of chambers. Also, a plate 25 is adhered to a back end surface 2B of the actuator board 2 so as to close alternate chambers. A manifold 22 is adhered so as to cover the plate 25. Accordingly, dummy channels 26 in which ink is not supplied and the ejection channels 11 in which ink is supplied through an opening 25A of the plate 25 are formed alternately in the actuator board 2 in the width direction thereof. Furthermore, the front end surface 2D of the actuator board 2 and a front surface of the cover plate 10' are subjected to a grinding process and, thereafter, a nozzle plate 12 having a plurality of nozzles 13 in one-to-one correspondence with the ejection channels 11 is adhered to the front surfaces and subjected to cleaning, thus completing the producing of the ink jet head 31.

According to the above embodiment shown in FIGS. 1 to 9, as described above, after the conductive layer Ds connected to all of the electrodes 5 provided independently of each other on both sides of the piezoelectric walls 3 has been formed on the bottom surface 2C of the actuator board 2 opposite to the other surface where the concave grooves 4 are formed, a part of the conductive layer Ds is divided by the dividing lateral grooves 15 into a plurality of conductive patterns 7 which are arranged parallel on the actuator board 2 in the width direction and connected respectively with a pair of electrodes 5 facing to each other in the concave groove 4. The conductive patterns 7 are separated by the dividing longitudinal groove 16 from the other portion of the conductive layer Ds, so that the conductive patterns 7 can be formed independently of each other. Accordingly, only if the lead wires 6A of the flexible board 6 are connected with the conductive patterns 7 respectively, the electrodes can be connected to the control unit 8, thus achieving a decrease in connecting operation and enhancing the reliability of the connection between the electrodes and the control unit, thus enabling to produce the ink jet head 1 with high reliability.

In the above embodiment, the dicing process or the parallel scan of the YAG laser beam is repeated plural times to form a plurality of lateral grooves 15 thereby to divide the conductive layer Ds into the conductive patterns 7. In this way, the division and formation of the conductive patterns 7 are conducted in simple processes, further ensuring the division thereof.

Next, a method for producing an ink jet head in the second embodiment will be described with reference to FIGS. 10 to 13, where a structure of the ink jet head is also explained.

Figure 10:
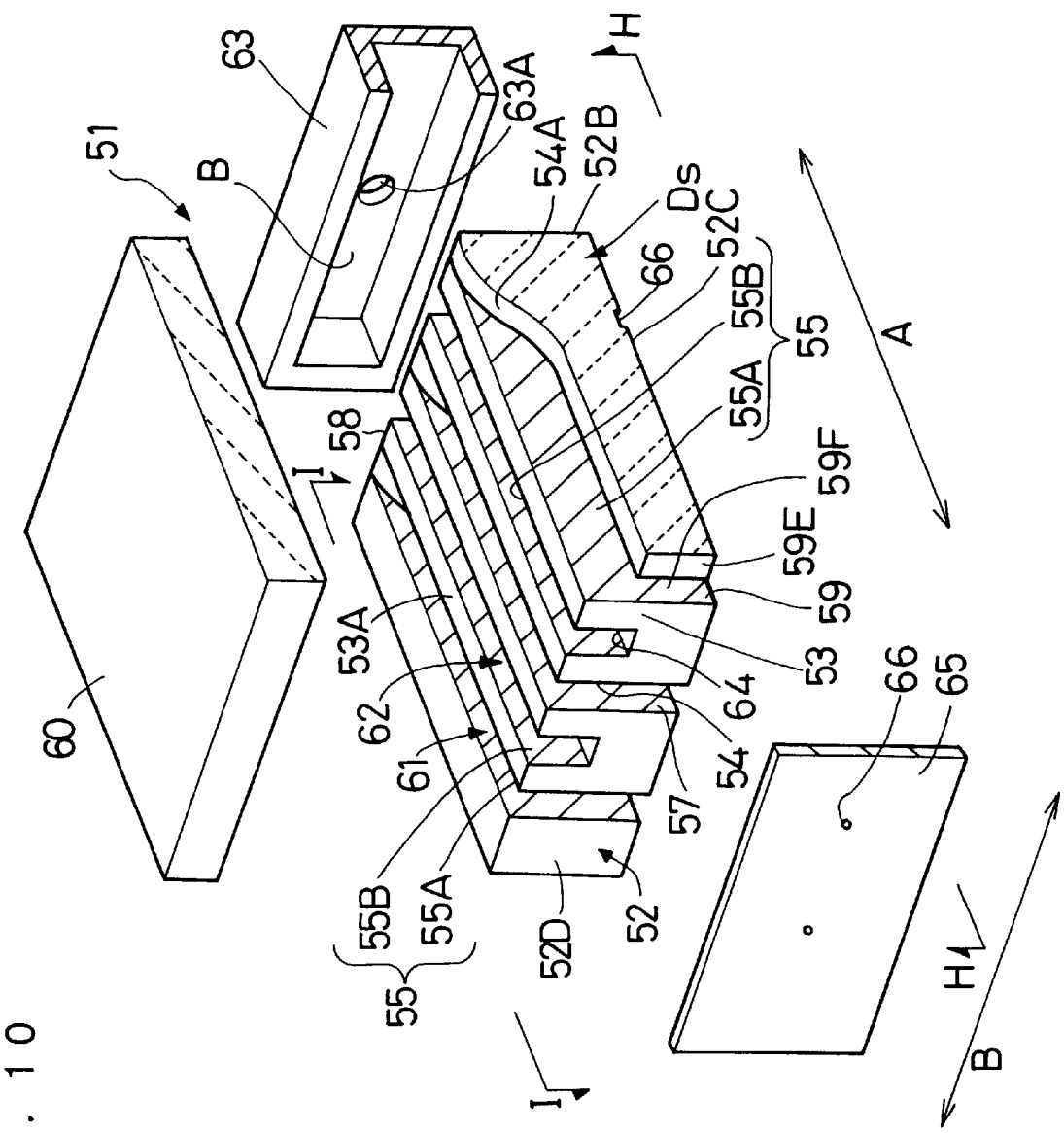
FIG. 10 is a perspective view of an ink jet head in a second embodiment.
Figure 11:
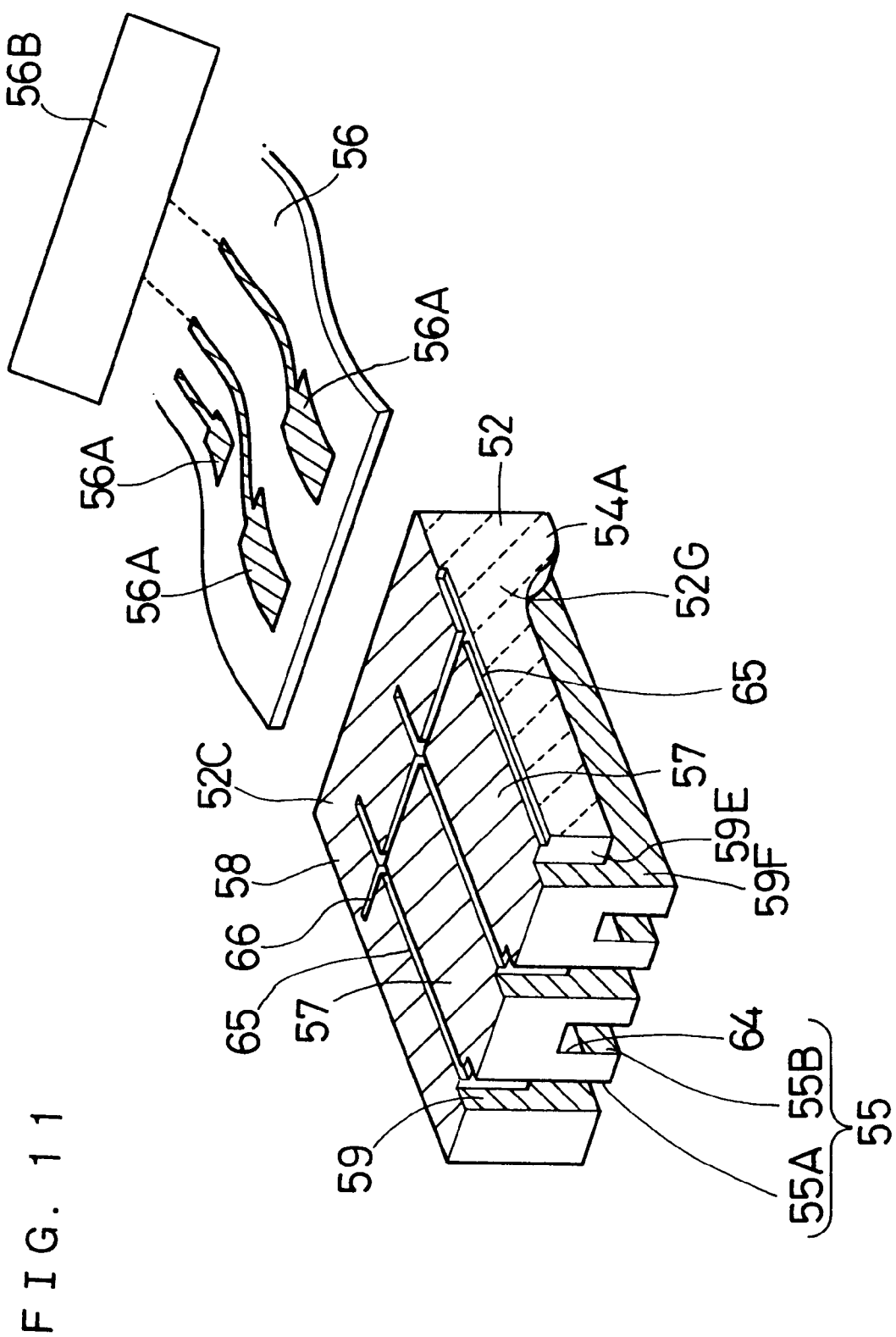
FIG. 11 is a perspective view of the ink jet head taken along the line H—H in FIG. 10.
Figure 12:
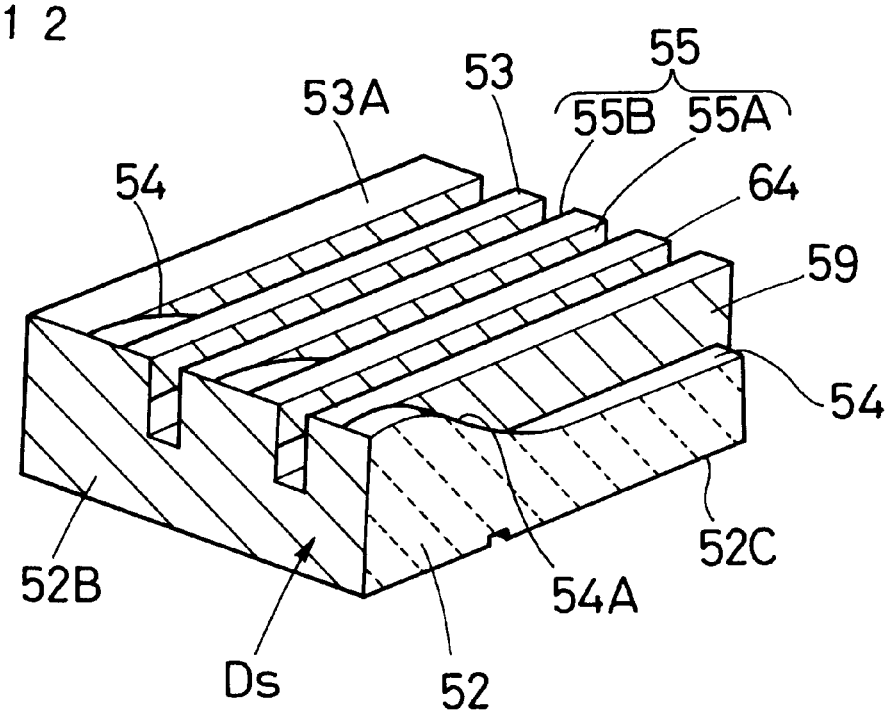
FIG. 12 is a perspective view of the ink jet head taken along the line I—I in FIG. 10.

In FIG. 10, an ink jet head 51 is provided an actuator board 52 which is a piezoelectric element. On the actuator board 52, plural concave grooves 64 and 54 (first and second concave grooves) of two kinds extending between a front end surface 52D and a back end surface 52B of the actuator board 52 are formed alternately in the width direction (the direction B in FIG. 10) of the actuator board 52, forming piezoelectric walls 53 (energy generating means) between the adjacent concave grooves 54 and 64. Each of the concave grooves 54 has an open end at the front end surface 52D of the actuator board 52 and a closed portion 54A at the back end surface 52B side, the closing portion 54A being formed by raising the bottom of the concave groove 54. Each of the concave grooves 64 has open ends at the both back and front end surfaces 52B and 52D. On the front end surface 52D of the actuator board 52, formed are vertical grooves 59 going through the actuator board 52 in its thickness direction, which are connected with the front ends of the concave grooves 54 respectively. The front ends of the concave grooves 54 thus form steps with respect to the front ends of the concave grooves 64. Each of the piezoelectric walls 53 is constructed of two piezoelectric layers, as shown in FIG. 13, which are polarized respectively in the height direction of the wall to be opposite in polarity to each other. A pair of electrodes 55 are formed on both surfaces of each piezoelectric wall 53. Each pair of electrodes 55 include two electrodes 55A and 55B provided independently of each other on both surfaces of each piezoelectric wall 53. The electrodes 55A provided on the walls 53 facing the concave groove 54 are electrically connected with the individual conductive patterns 57 each formed on a side surface 59F of the vertical groove 59 and a bottom surface 52C as shown in FIG. 11. Additionally, two electrodes 55A and 55A positioned outside when seen from the concave groove 64 with respect to the adjacent piezoelectric walls 53 are also conductably connected with the same conductive pattern 57 on the bottom surface 52C, which forming a set. The electrodes 55B at the concave groove 64 side are electrically connected with a common conductive pattern 58 formed continuously on the back end of the concave groove 64, the back end surface 52B, and the bottom surface 52C, as shown in FIG. 12. The plural individual conductive patterns 57 and the common conductive pattern 58 are, as mentioned later, electrically separated from each other by grooves 65 (first groove) and 66 (second groove). The individual conductive patterns 57 are provided extending in the front and rear direction (the direction A in FIG. 10) of the actuator board 52 so as to be arranged parallel to each other on the bottom surface 52C. Those conductive patterns 57 are connected with a control unit 56B of the recording apparatus for supplying driving voltage, as well as the common conductive pattern 58, through lead wires 56A of a flexible board 56.

A cover plate 60 is adhered to a grooved side of the actuator board 52. This cover plate 60 and the concave grooves 54 form dummy channels in which ink is not supplied, while the cover plate 60 and the concave grooves 64 form ejection channels 62 in which ink is supplied. A nozzle plate 67 is adhered to the front end surface 52D of the actuator board 52 and the cover plate 60 to close the ejection channels 62. The nozzle plate 65 is provided with a plurality of nozzles 68 in one-to-one correspondence to the ejection channels 62. Adhered on the back end surface 52B of the actuator board 52 is a manifold 63 having an ink supply port 63 connected to a common ink chamber B. Each of the ejection channels 62 is connected to an ink storing tank not shown through the common ink chamber B and the ink supply port 63A.

The ink jet head 51 constructed as above is produced in the following producing method, which is explained with reference to FIGS. 10 to 12.

In FIG. 10, the quadrilateral actuator board 52 is formed such that piezoelectric ceramic layers which are polarized in opposite directions to each other are stacked and adhered. Then, a grooving process is applied to the actuator board 52 plural times to make the concave grooves 54 which open at an end of the actuator board 52 in the front and rear direction and extend close to the other end and the ink concave grooves 64 entirely extending in the front and rear direction so that those grooves 54 and 64 are arranged alternately in the width direction of the actuator board 52, thus forming a plurality of piezoelectric walls 53 extending in the front and rear direction between the adjacent concave grooves 54 and 64. A vertical groove 59 is formed at a front end of each concave groove 54, providing an inside step to each concave groove 54 with respect to each ink concave groove 64. For a grooving device, a diamond blade having the thickness capable of forming each of the concave grooves 54 and 64 is used in a dicing process.

Next, a conductive layer Ds of a metallic thin film is formed, for example, by a vacuum deposition on the back end surface 52B and the bottom surface 52C opposite to the grooved side of the actuator board 52, upper surfaces 53A and each side surface (including the side surfaces of the vertical grooves 59) of the piezoelectric walls 53. After the formation of the conductive layer Ds on the actuator board 52, a grinding process is applied to the upper surfaces 53A of the piezoelectric walls 53 to remove the conductive layer Ds therefrom. This results in the formation of a pair of electrodes 55 formed of metallic thin film including two electrodes 55A and 55B provided on both side surfaces of the piezoelectric wall 53 respectively so as to be independently divided. The electrodes 55B facing to each other in the concave grooves 64 are conductably connected with the conductive layer Ds on the back end surface 52B and the bottom surface 52C of the actuator board 52. Also, the electrodes 55A facing to each in the concave grooves 54 are conductably connected with the conductive layer Ds of the side surface 59F provided in the step between the concave grooves 54 and 64, and the bottom surface 52C of the actuator board 52.

It is noted that the forming method for the conductive layer Ds of the actuator board 52 is not limited to the vacuum deposition. It may be formed, for example, in a manner that the whole surface of the actuator board 52 including the inside surfaces of the concave grooves 54 and 64 are covered with the conductive layer Ds of a metallic thin film by a surface process such as metal plating (for instance, nickel plating), and then the conductive layer Ds is removed from the upper surfaces 53A of the piezoelectric walls 53, the closing portions 54A of the concave grooves 54, and front surface 52D of the actuator board 52 by a grinding process, and the conductive layer Ds is removed from the bottom surfaces of the concave grooves 54 and the bottom surfaces 59E of the vertical grooves 59 by a dicing process to divide independently the pairs of electrodes 55. A laser beam also may be used to remove the conductive layer on the above portions. Furthermore, with respect to an portion of the actuator board 52 which do not need to be provided with the conductive layer Ds (the above mentioned portions from which the conductive layer is to be removed), it is also possible to form a resist film prior to the formation of the conductive layer Ds of a metallic thin film, and form the conductive layer Ds by a surface process such as plating and the like, thereafter, chemically remove the conductive layer Ds of the portion not requiring the conductive layer by a lift-off system.

In order to connect each pair of electrodes 55 provided on each piezoelectric wall 53 to the control unit 59 of the recording apparatus, the conductive layer Ds on the bottom surface 52C of the actuator board 52 is divided into a plurality of individual conductive patterns 57 and the common conductive pattern 58.

More specifically, as shown in FIG. 11, a plurality of dividing lateral grooves 65 are formed on the bottom surface of the actuator board 52 so that an end of each groove 65 is connected with each bottom surface 59E of the vertical groove 59 and each groove 65 extends parallel to each concave groove 54. On the bottom surface 52C, furthermore, a dividing longitudinal groove 66 is formed intersecting with the plural dividing lateral grooves 65 to separate the tip end portion of each individual conductive pattern 57 between the lateral grooves 65 from each other and also from the common conductive pattern 58. In this regard, the lateral grooves 65 and the longitudinal groove 66 are formed by the dicing process or the scanning process using a YAG laser beam similarly to the above embodiment shown in FIGS. 4(a) and (b).

Accordingly, the conductive layer Ds provided on the actuator board 52 is divided into the individual conductive patterns 57 which are arranged parallel to each other in the width direction of the actuator board 52 and extended in the back and rear direction and the common conductive pattern 58 which is other portion except for the individual conductive patterns 57. Each of the individual conductive patterns 57 is connected with a set of electrodes 55A and 55A each provided in two adjacent concave grooves 54 respectively at the intermediate concave groove 64 side positioning between the two adjacent concave grooves 54, among the electrode pairs on the piezoelectric walls 53, through the conductive layer on the side surface 59F of the vertical groove 59. The common conductive pattern 58 is connected with the electrodes 55B provided on the walls 53 opposite in the concave groove 64 through the conductive layer on the back end surface 52B.

In this regard, in the case of removing the conductive layer on the front end surface 52D and the bottom surface 59E of the vertical groove 59 after covering the whole surface of the actuator board 52 with the conductive layer, this removing operation makes the conductive layer on the side surface 59F of the vertical groove 59 be divided from other portions of the conductive layer. Such the division of the conductive layer on this portion constitutes a part of a process of forming the individual divided conductive patterns 57. Also, since both electrodes 55B in the concave groove 64 are connected with the common conductive pattern 58 as shown in FIG. 13 mentioned later, they are not required to be separated from each other at the bottom surface of the concave groove.

After the formation of the pairs of electrodes 55, the piezoelectric walls 53 (energy generating means), the conductive patterns 57 and 58 on the actuator board 52, the actuator board 52 is coated with, for example, gold-plating and is subjected to a CVD process to protect the gold-plating with an oxide film (SiO film) in order to protect the conductive layer Ds (metallic thin film) provided on each pair of electrodes 55, and on the conductive patterns 57 and 58. After the protection of the conductive layer Ds with the gold-plating and the oxide film, the cover plate 60 is adhered to the grooved side of the actuator board 52 as shown in FIG. 10. Thus, the cover plate 60 and the concave grooves 54 constitute the dummy channels 61 and the ejection channels 62 so as to appear alternately. A grinding process is applied to the front end surface 52D of the actuator board 52 and the front surface of the cover plate 60 to make them smooth. The nozzle plate 67 is adhered to the front surfaces so that the nozzles 68 are in one-to-one correspondence to the ejection channels 62. The manifold 63 is also adhered on the back end surface 52B of the actuator board 52. After cleaning, the ink jet head 51 is completely produced.

When the ink jet head 51 produced as above is installed in the recording apparatus and is connected to an ink storing tank through the ink supply port 63A of the manifold 63, each of the ejection channels 62 is filled with ink. During the installation of the ink jet head 51 in the recording apparatus, each of the individual conductive patterns 57 and the common conductive pattern 58 are connected respectively to the control unit 56B of the recording apparatus through the lead wires 56A of the flexible board 56 as shown in FIG. 11.

Figure 13:
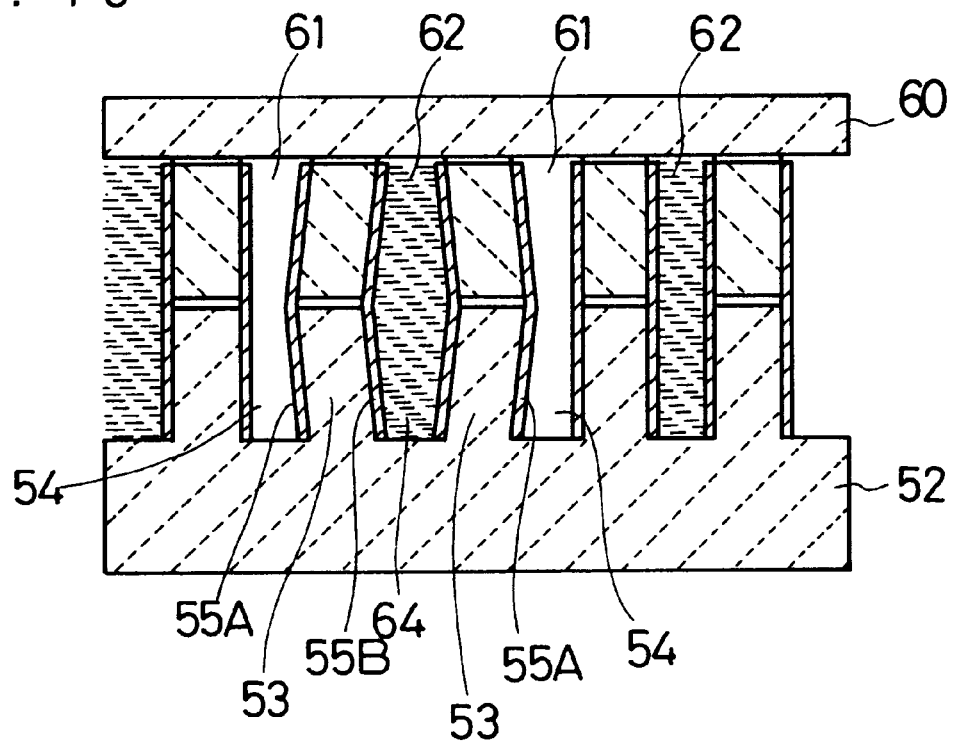
FIG. 13 is an enlarged sectional view of the ink jet head of FIG. 10 in an operation state.

And, in the ink jet head 51, as shown in FIG. 13, a predetermined ejection channel 62 is selected according to data including characters or figures to be recorded. Negative driving voltage (minus voltage) is applied through the common conductive pattern 58 to two electrodes 55B and 55B opposite to each other in the ejection channel 62 among the pairs of electrodes 55 of the adjacent two piezoelectric walls 53, and positive driving voltage (plus voltage) is applied through the individual conductive pattern 57 to other two electrodes 55A and 55A in the dummy channel 61 among the pairs of electrodes 55. This causes deformation of the adjacent piezoelectric walls 53 so as to increase the volume of the ejection channel 62 which is to eject ink, whereby ink is supplied from the manifold 63 into the ejection channel 62. When application of driving voltage to the electrodes 55 is stopped, the piezoelectric walls 53 return to a straight state, applying pressure to the ink in the increased ejection channel 62 thereby to eject ink droplets through the nozzle 68. The control of the applied driving voltage is conducted for each of the ejection channels 62 to appropriately control the ejection of ink droplets through the corresponding nozzle 68 to print data including characters and figures onto a printing sheet.

Figure 14:
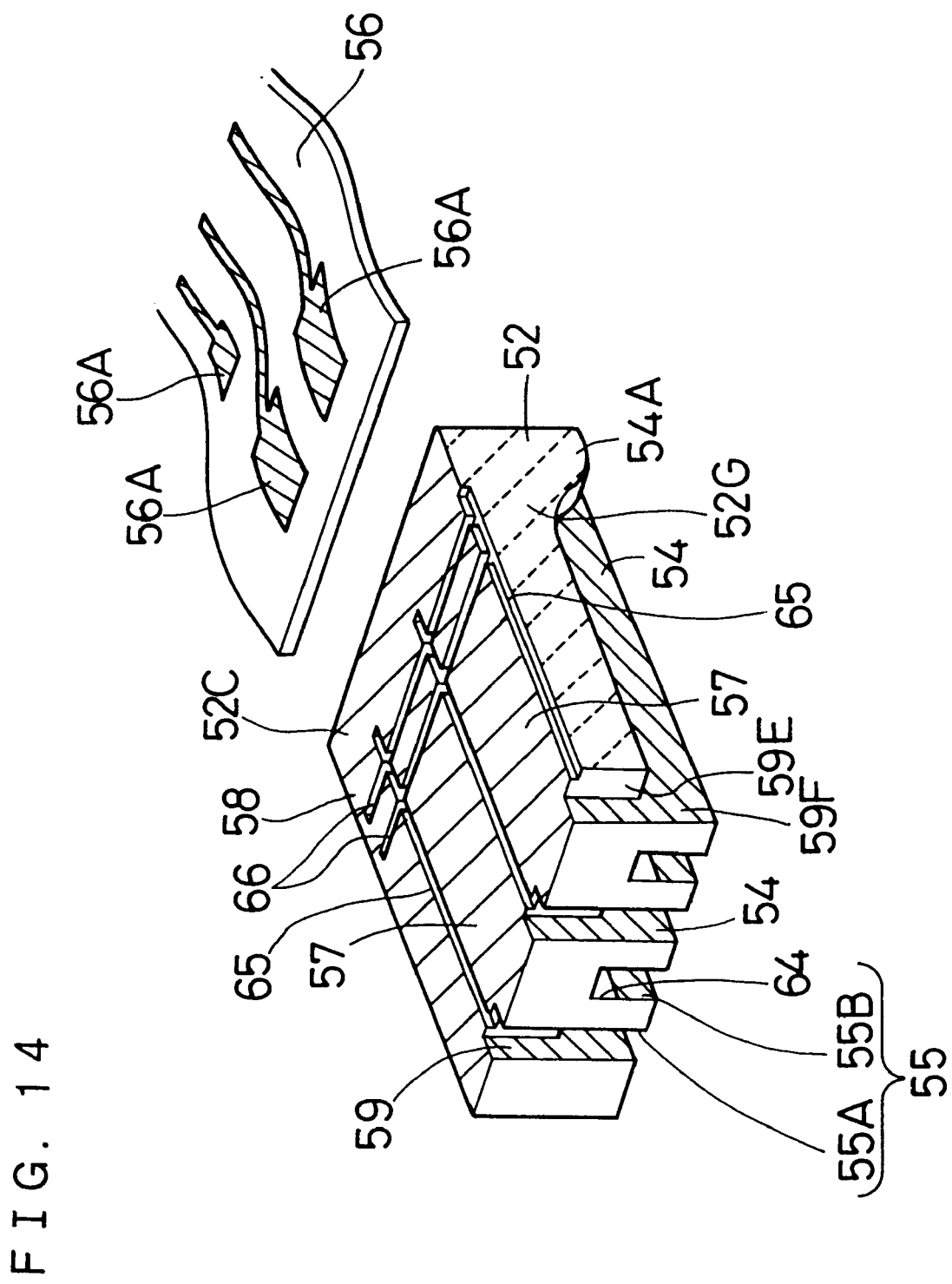
FIG. 14 is a perspective view of a modification of the ink jet head of FIG. 10.
Figure 15:
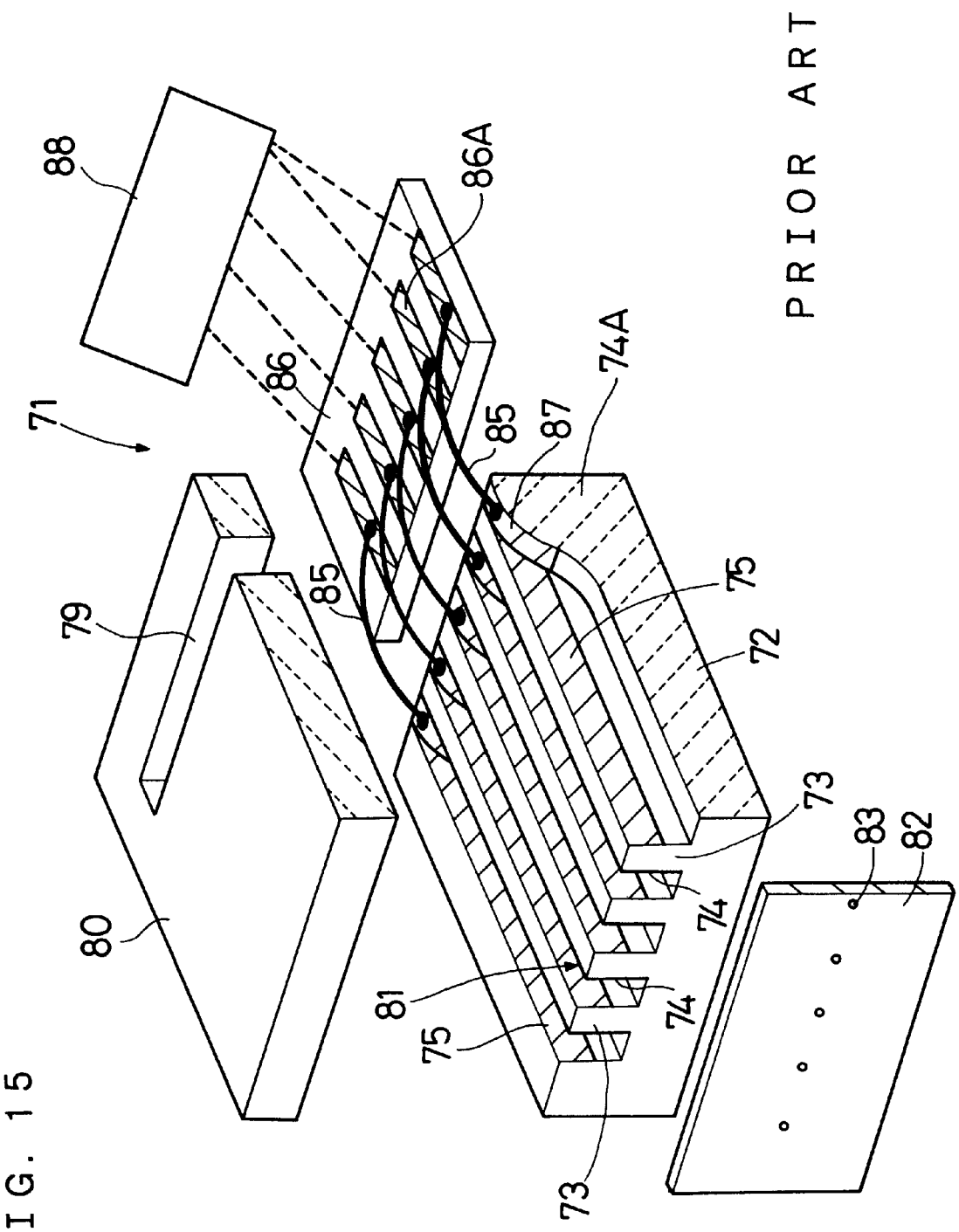
FIG. 15 is a perspective view of an ink jet head in the prior art.

It is noted that the individual conductive patterns 57 and the common conductive pattern 58 are divided by one longitudinal groove 66 in the above embodiment, but they may be divided, as shown in FIG. 14, by two longitudinal grooves 66 which intersect with the lateral grooves 65. Accordingly, the individual conductive patterns 57 and the common conductive pattern 58 can be surely divided. Also, in the above embodiment, two longitudinal grooves 66 may be used.

According to the above embodiment shown in FIGS. 10 to 12, as described above, after the conductive layer Ds connected to all of the electrodes 55 has been formed on the bottom surface 52C of the actuator board 52 opposite to the grooved (ejection channels 62) side, a part of the conductive layer Ds is divided by the dividing lateral grooves 65 into a plurality of conductive patterns 57 individually for one electrode 55A of the pair of electrodes 55, and the other portion of the conductive layer Ds is divided by the dividing longitudinal groove 66 into the individual conductive patterns 57 and the common conductive pattern 58 connected with another electrode 55B of the pair of electrodes 55. The individual conductive patterns 57 are independently of each other connected with the electrodes 55A and, independently therefrom, the common conductive pattern 58 is connected with the electrodes 55B. Accordingly, the number of conductive patterns can be reduced as compared with the structure where common conductive patterns are provided independently for every electrodes. As a result, the connecting operation with respect to the control unit 59 can reduced, preventing the connection failure, and also the individual conductive patterns 57 and the common conductive pattern 58 are provided independently of each other, so that the ink jet head 51 with high reliability can be produced.

In the above embodiment, the individual conductive patterns 57 and the common conductive pattern 58 are divided and formed on the front and back ends of the actuator board 52 respectively, such that each of the individual conductive patterns 57 is connected with one electrode 55A of a pair of electrodes 55 at one end of the ejection channel 62 in the lengthwise direction and the common conductive pattern 58 is connected with another electrode 55B of the pair of electrodes 55 at another end of the ejection channel 62 in the lengthwise direction. Accordingly, the conductive patterns 57 and 58 are not required to be arranged with a small pitch and can be surely made independent of each other. The ink jet head 51 with high reliability thus can be produced.

Also, in the above embodiment, since a pair of electrodes 55 are formed on both side surfaces of the piezoelectric wall 53 between the ejection channel 62 and the dummy channel 61, the conductive patterns 57 and 58 can be made independent and connected with the electrodes 55A and 55B of the electrode pair 55, respectively.

Furthermore, the individual conductive patterns 57 are divided by the dicing process or the parallel scan of the YAG laser beam to form a plurality of lateral grooves 65, so that the division and formation of the conductive patterns 57 are conducted in simple processes, ensuring the division thereof.

As mentioned in detail above, according to the method for producing an ink jet head of the present invention, after the conductive layer conductable to all of the electrodes is formed on a surface of the actuator board different from another surface thereof on which ejection channels are formed, a part of the conductive layer is divided into a plurality of conductive patterns each end of which is connected with the electrode, and another end of which is divided from another portion of the conductive layer. This makes it possible to ensure independence of each conductive pattern. Accordingly, an ink jet head with the high reliability on connection between the electrodes and the control unit and also the high reliability on ink ejection.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for producing an ink jet head comprising the steps of:

forming an actuator board having a parallelepiped shape with a first plane and a second plane, which is made of piezoelectric ceramic material;

forming a plurality of piezoelectric walls by making grooves in the first plane of the actuator board in a longitudinal direction thereof;

forming conductive layers made of metallic thin film on a part of both side surfaces of the piezoelectric walls, a first end plane of the actuator board, and an entire surface of the second plane of the actuator board so that the conductive layers are connected with each other;

forming a plurality of conductive patterns, each of which is conductably connected with the conductive layer formed on the side surfaces of the piezoelectric walls, on the second plane of the actuator board by forming first grooves in the conductive layer formed on the first end plane of the actuator board in a vertical direction in correspondence with each of the piezoelectric walls and forming second grooves in the conductive layer formed on the second plane of the actuator board so as to be continuous to the first grooves;

electrically dividing the conductive layer on the second plane of the actuator board into the conductive patterns and another remaining part of the conductive layer by forming a third groove intersecting the second grooves;

adhering a cover plate onto the first plane of the actuator board so as to cover the piezoelectric walls; and adhering a nozzle plate onto a second end plane of the actuator board, the nozzle plate being provided with nozzles in correspondence to ejection channels each formed between the piezoelectric walls.

2. An ink jet head producing method according to claim 1, wherein the piezoelectric wall forming step is performed by a dicing process using a diamond blade to make grooves in the first plane of the actuator board.

3. An ink jet head producing method according to claim 1, wherein the conductive layer forming step is performed by a vacuum deposition.

4. An ink jet head producing method according to claim 1, wherein the conductive pattern forming step is performed by a dicing process using a diamond blade or a laser beam machining process to form the first grooves in the conductive layer on the first end plane.

5. An ink jet head producing method according to claim 1, wherein the dividing step is conducted by a dicing process using a diamond blade or a laser beam machining process to form the third groove.

6. An ink jet head producing method according to claim 1, wherein a protective film is formed on the conductive layer after completion of the dividing step.

7. An ink jet head producing method according to claim 6, wherein the protective film is formed in a manner that the conductive layer is coated by a gold-plating layer and then the gold-plating layer is coated by an oxide film.

8. An ink jet head producing method according to claim 1, wherein the dividing step is performed by forming a plurality of third grooves in parallel with each other.

9. An ink jet head producing method according to claim 1, wherein the conductive layer forming step is performed by a plating process.

10. A method for producing an ink jet head comprising the steps of:

forming an actuator board having a parallelepiped shape with a first plane and a second plane, which is made of piezoelectric ceramic material;

forming a plurality of piezoelectric walls by forming grooves in the first plane of the actuator board in a longitudinal direction thereof to alternately make first concave grooves extending from a first end plane of the actuator board to a second end plane and second concave grooves on the first plane which open at the first end plane of the actuator board and close at the second end plane;

forming conductive layers made of metallic thin film on side surfaces of the piezoelectric walls opposite to each other in the first concave groove, the second end plane of the actuator board, and an entire surface of the second plane of the actuator board so that the conductive layers are connected with each other, and on side surfaces of the piezoelectric walls opposite to each other in the second concave groove so as to be connected with the conductive layer on the second plane of the actuator board;

forming a plurality of individual conductive patterns in the second plane of the actuator board by forming first grooves in the conductive layer formed on the second plane of the actuator board in correspondence with each of the second concave grooves to connect the conductive layers formed on the side planes of the piezoelectric walls constructing two adjacent second concave grooves between which the first concave groove is provided;

forming a common conductive pattern by forming a second groove intersecting the first grooves thereby to divide the conductive layer formed on the second plane of the actuator board into the individual conductive patterns and another remaining part of the conductive layer;

adhering a cover plate on the first plane of the actuator board so as to cover the piezoelectric walls; and adhering a nozzle plate on the first end plane of the actuator board, the nozzle plate being provided with nozzles in correspondence to ejection channels each formed between the piezoelectric walls.

11. An ink jet head producing method according to claim 10, wherein the piezoelectric wall forming step is performed by a dicing process using a diamond blade to make grooves in the first plane of the actuator board.

12. An ink jet head producing method according to claim 10, wherein the conductive layer forming step is performed by a vacuum deposition.

13. An in jet head producing method according to claim 10, wherein the individual conductive pattern forming step is performed by a dicing process using a diamond blade or a laser beam machining process to form the first grooves in the conductive layer on the second plane of the actuator board.

14. An ink jet head producing method according to claim 10, wherein the common conductive pattern forming step is performed by a dicing process using a diamond blade or a laser beam machining process to form the second groove.

15. An ink jet head producing method according to claim 10, wherein a protective film is formed on the conductive layer after completion of the common conductive pattern forming step.

16. An ink jet head producing method according to claim 15, wherein the protective film is formed in a manner that the conductive layer is coated by a gold-plating layer and then the gold-plating layer is coated by an oxide film.

17. An ink jet head producing method according to claim 10, wherein the common conductive pattern forming step is conducted by forming a plurality of second grooves in parallel with each other.

18. An ink jet head producing method according to claim 10, wherein the second concave groove is used as a dummy channel which does not eject ink, and the conductive layer is formed on the side plane of each of the piezoelectric walls constructing dummy channel.

19. An ink jet head producing method according to claim 10, wherein the conductive layer forming step is performed by a plating process.

* * * * *